US012740264B2

(12) United States Patent
Zhao et al.

(10) Patent No.: US 12,740,264 B2
(45) Date of Patent: Sep. 15, 2026

(54) DISPLAY PANEL COMPRISING FIRST AND SECOND METAL LAYERS BETWEEN FIRST PINS AND DISPLAY DEVICE COMPRISING THE SAME

(71) Applicants: Chongqing BOE Display Technology Co., Ltd., Chongqing (CN); BOE Technology Group Co., Ltd., Beijing (CN)

(72) Inventors: Tianlong Zhao, Beijing (CN); Yaqian Zhang, Beijing (CN); Bo Wang, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 368 days.

(21) Appl. No.: 18/283,820

(22) PCT Filed: Feb. 18, 2022

(86) PCT No.: PCT/CN2022/076789
§ 371 (c)(1),
(2) Date: Sep. 25, 2023

(87) PCT Pub. No.: WO2023/155121
PCT Pub. Date: Aug. 24, 2023

(65) Prior Publication Data

US 2024/0297185 A1 Sep. 5, 2024

(51) Int. Cl.
*H10K 59/131* (2023.01)
*G06F 3/041* (2006.01)

(52) U.S. Cl.
CPC .......... *H10K 59/131* (2023.02); *G06F 3/041* (2013.01); *G06F 3/0412* (2013.01)

(58) Field of Classification Search
None
See application file for complete search history.

(56) References Cited

U.S. PATENT DOCUMENTS

2020/0119050 A1 4/2020 Li
2022/0005909 A1 1/2022 Du et al.
2022/0328599 A1* 10/2022 Zhang ................ G01R 31/2884

FOREIGN PATENT DOCUMENTS

CN 113661476 A 11/2021
WO 2021/077332 A1 4/2021
WO WO-2021179251 A1 * 9/2021 ......... G01R 31/2884

OTHER PUBLICATIONS

International Search Report and Written Opinion mailed on Sep. 1, 2022, in corresponding PCT/CN2022/076789, 8 pages.

* cited by examiner

*Primary Examiner* — Daniel Whalen
(74) *Attorney, Agent, or Firm* — XSENSUS LLP

(57) ABSTRACT

A display panel includes: a substrate; a plurality of sub-pixels, located in a display area; a plurality of data lines, located in the display area and a non-display area and electrically connected to the plurality of the sub-pixels; a first insulating layer set, located at one side of the substrate and provided with a plurality of first openings located at intervals in the first region; a plurality of first pins, located in the plurality of the first openings and electrically connected to the data lines; a first metal layer, located between two adjacent first pins and electrically insulated from the two adjacent first pins; a first planarization layer, located at one side of the first metal layer away from the substrate; and a second metal layer, located at one side of the first planarization layer away from the substrate and electrically insulated from the two adjacent first pins.

20 Claims, 8 Drawing Sheets

128
1284
1282
1283
1281
126
125
1223
122
1222
124
1221
123
129
1
127
1214 1215 1216 1219 1217 1211 1213 1218 1212
121

1022
1022
1014
1021
1013
101
1012
120
1011
1

DISPLAY PANEL COMPRISING FIRST AND SECOND METAL LAYERS BETWEEN FIRST PINS AND DISPLAY DEVICE COMPRISING THE SAME

CROSS-REFERENCE TO RELATED APPLICATION

The present application is the U.S. National Stage of International Application No. PCT/CN2022/076789, filed on Feb. 18, 2022, the contents of which are incorporated herein by reference in their entireties for all purposes.

TECHNICAL FIELD

The present disclosure relates to the field of display technologies, and specifically to a display panel and a display device.

BACKGROUND

Bonding is an indispensable process in the field of the display technologies, in which pins of electronic devices to be connected are usually connected to pins in a bonding region of the display panel.

During a reliability verification process, it is found that the planarization layer peels off from film layers in contact with opposite sides of the planarization layer, resulting in poor contact between the pins in the bonding region of the display panel and the pins of the electronic devices to be connected.

It should be noted that the information disclosed in the background section above is only used for enhancing understanding of the background of the present disclosure, and therefore may include information that does not constitute prior art known to those ordinary skilled in the art.

SUMMARY

The purpose of the present disclosure is to overcome the above-described deficiencies in the prior art and to provide a display panel and a display device.

According to an aspect of the present disclosure, a display panel is provided. The display panel is provided with a display area and a non-display area at least located at one side of the display area. The non-display area includes a first region. The display panel includes a substrate, a plurality of sub-pixels, a plurality of data lines, a first insulating layer set, a plurality of first pins, a first metal layer, a first planarization layer, and a second metal layer. The plurality of the sub-pixels are located in the display area. The plurality of the data lines are located in the display area and the non-display area and electrically connected to the plurality of the sub-pixels. The first insulating layer set is located at one side of the substrate. The first insulating layer set is provided with a plurality of first openings, and the plurality of the first openings are located at intervals in the first region. The plurality of the first pins are located in the plurality of the first openings in a corresponding manner and electrically connected to the plurality of the data lines. The first metal layer is located between two adjacent first pins and electrically insulated from the two adjacent first pins. The first planarization layer is located at one side of the first metal layer away from the substrate. The second metal layer is located at one side of the first planarization layer away from the substrate and electrically insulated from the two adjacent first pins.

In an embodiment of the present disclosure, the first planarization layer is provided with a first disconnection region exposing the first metal layer, and the second metal layer passes through the first disconnection region and is connected to the first metal layer.

In an embodiment of the present disclosure, the first insulating layer set between the two adjacent first pins is provided with a first groove, and the first metal layer is at least partially arranged in the first groove.

In an embodiment of the present disclosure, the display panel further includes a first insulating layer and a third metal layer. The first insulating layer is located at one side of the second metal layer away from the substrate and covers the second metal layer and the first planarization layer. Edge of the first insulating layer covers edge of one side of the first pin away from the substrate. The third metal layer is located at the side of the first pin away from the substrate and at one side of the first insulating layer away from the substrate.

In an embodiment of the present disclosure, the second metal layer covers the side of the first planarization layer away from the substrate and one side of the first pin away from the substrate. The first planarization layer is provided with a first disconnection region. The second metal layer is provided with a second disconnection region. An orthographic projection of the second disconnection region on the substrate is located within an orthographic projection of the first disconnection region on the substrate.

In an embodiment of the present disclosure, a third recess is arranged at the side of the first metal layer away from the substrate. A third protrusion is arranged at one side of the first planarization layer close to the substrate. The third protrusion is filled in the third recess. A fourth recess is arranged at the side of the first planarization layer away from the substrate. A fourth protrusion is arranged at one side of the second metal layer close to the substrate. The fourth protrusion is filled in the fourth recess.

In an embodiment of the present disclosure, the display panel further includes a first protection layer, located at one side of the first insulating layer set away from the substrate and located at one side of the first planarization layer closed to the substrate. A first recess is arranged at one side of the first protection layer away from the substrate. The first planarization layer is provided with a first protrusion matching the first recess. The first protrusion is filled in the first recess.

In an embodiment of the present disclosure, the first recess passes through the first protection layer, and the first protrusion passes through the first recess and is connected to the first insulating layer set.

In an embodiment of the present disclosure, the first recess includes at least two strip-shaped grooves distributed in parallel. The first protrusion includes at least two convex bars.

In an embodiment of the present disclosure, along a direction perpendicular to an extension direction of the strip-shaped groove, the strip-shaped groove is provided with a rectangular, curved or triangular cross-sectional shape, and the convex bar is provided with a rectangular, curved or triangular cross-sectional shape matching the cross-sectional shape of the strip-shaped groove.

In an embodiment of the present disclosure, the first recess includes a plurality of dot-shaped recessing portions distributed in an array. The first protrusion includes protrusions being in one-to-one correspondence with each of the dot-shaped recessing portions.

In an embodiment of the present disclosure, the display panel further includes a fourth metal layer, located between the first pin and the third metal layer. One side of the fourth metal layer away from the substrate is flush with the side of the first insulating layer away from the substrate.

In an embodiment of the present disclosure, the non-display area further includes a second region, In the second region, the display panel further includes a second insulating layer set, a plurality of second pins, a second protection layer, a second planarization layer, and a second insulating layer. The second insulating layer set is located at a same side of the substrate as the first insulating layer set. The plurality of the second pins are located at one side of the second insulating layer set away from the substrate. The second protection layer is located at the side of the second insulating layer set away from the substrate and between two adjacent second pins. A second recess is arranged at one side of the second protection layer away from the substrate. The second planarization layer is located at the side of the second protection layer away from the substrate. The second planarization layer is provided with a second protrusion matching the second recess. The second protrusion is filled in the second recess. The second insulating layer is located at one side of the second planarization layer away from the substrate and located in a partial area at one side of the second pin away from the substrate.

In an embodiment of the present disclosure, the display panel further includes a sixth metal layer and a fifth metal layer. The sixth metal layer is located at the side of the second pin away from the substrate. One side of the sixth metal layer away from the substrate is flush with one side of the second insulating layer away from the substrate. The fifth metal layer is located at the side of the sixth metal layer away from the substrate. The fifth metal layer covers the sixth metal layer and is located at the side of the second insulating layer away from the substrate.

In an embodiment of the present disclosure, the sixth metal layer is provided in a same layer and formed in a same material as the second metal layer. The fifth metal layer is provided in a same layer and formed in a same material as the third metal layer.

In an embodiment of the present disclosure, the first pin includes a first electrode portion and a second electrode portion. The first electrode portion is located at one side of the substrate. The second electrode portion is located at one side of the first electrode portion away from the substrate. At least part of the second electrode portion is located at one side of the first insulating layer set away from the substrate. Edge of one side of the second electrode portion away from the substrate is covered by the first planarization layer.

In an embodiment of the present disclosure, the second electrode portion includes a first conductive portion and a second conductive portion. The first conductive portion is located at the side of the first electrode portion away from the substrate. At least part of the first conductive portion is located at the side of the first insulating layer set away from the substrate. The second conductive portion covers the first conductive portion, and is at least partially located at the side of the first insulating layer set away from the substrate.

In an embodiment of the present disclosure, the second conductive portion is provided in a same layer and formed in a same material as the first metal layer.

In an embodiment of the present disclosure, the first insulating layer set includes a first insulating sub-layer, a second insulating sub-layer, a third insulating sub-layer, and a fourth insulating sub-layer arranged sequentially along a direction away from the substrate. The second insulating layer set includes a fifth insulating sub-layer, a sixth insulating sub-layer, a seventh insulating sub-layer, and an eighth insulating sub-layer arranged sequentially along a direction away from the substrate. The first insulating sub-layer is provided in a same layer and formed in a same material as the fourth insulating sub-layer. The second insulating sub-layer is provided in a same layer and formed in a same material as the fifth insulating sub-layer. The third insulating sub-layer is provided in a same layer and formed in a same material as the sixth insulating sub-layer. The fourth insulating sub-layer is provided in a same layer and formed in a same material as the eighth insulating sub-layer.

According to another aspect of the present disclosure, a display device is provided. The display device includes a chip, a circuit board and the display panel according to the aspect of the present disclosure described above. The first pin is connected to one or both of a pin of the chip and a pin of the circuit board by means of a conductive adhesive.

According to another aspect of the present disclosure, the first pin is connected to the pin of the chip by means of the conductive adhesive, and the second pin is connected to the pin of the circuit board by means of the conductive adhesive.

It should be understood that the above general description and the later detailed description are exemplary and explanatory only and do not limit the present disclosure.

BRIEF DESCRIPTION OF THE DRAWINGS

The accompanying drawings herein are incorporated into and form part of the specification, illustrate embodiments consistent with the present disclosure, and are used in conjunction with the specification to explain the principles of the present disclosure. Obviously, the accompanying drawings in the following description are only some of the embodiments of the present disclosure, and other accompanying drawings may be obtained from these drawings by those ordinary skilled in the art without creative labor.

DETAILED DESCRIPTION

Figure 1:
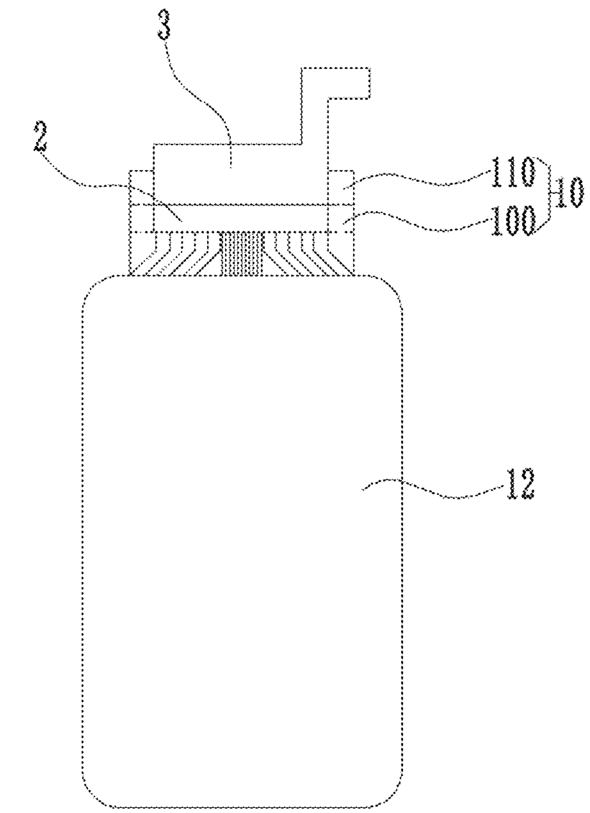
FIG. 1 is a schematic structural diagram of a display device involved in an embodiment of the present disclosure.

Exemplary embodiments will now be described more fully with reference to the accompanying drawings. Exemplary embodiments may, however, be implemented in many forms and should not be construed as limited to the embodiments set forth herein. Instead, these embodiments are provided so that the present disclosure will be thorough and complete, and will fully convey the concept of exemplary embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "up" and "down" are used in the specification to describe the relative relationship between one component and another component shown in the drawings, these terms are only used for convenience in the specification, for example, according to the direction of the examples described in the accompanying drawings. It can be understood that if the device shown in the drawings is flipped so that it is upside down, the component described as "up" will become the component described as "down". When a certain structure is provided "on" another structure, it may refer to the certain structure being formed on the another structure as a whole, or the certain structure being "directly" provided on the another structure, or the certain structure being "indirectly" provided on the another structure through yet another structure.

The terms "a", "an", "the", "said", and "at least one" are used to indicate the presence of one or more elements/components and the like. The terms "include" and "have" are used to indicate a non-exclusive inclusion and mean that there may be additional elements/components and the like in addition to the listed elements/components and the like. The terms "first", "second", "third" and the like are only used as markers, without limiting the number of objects related thereto.

The electronic devices to be connected may include a chip and a circuit board. The chip and the circuit board may be connected by using pins in the same region or in different regions. An example is illustrated by the fact that the chip and the circuit board may be connected by using pins in different regions.

Figure 2:
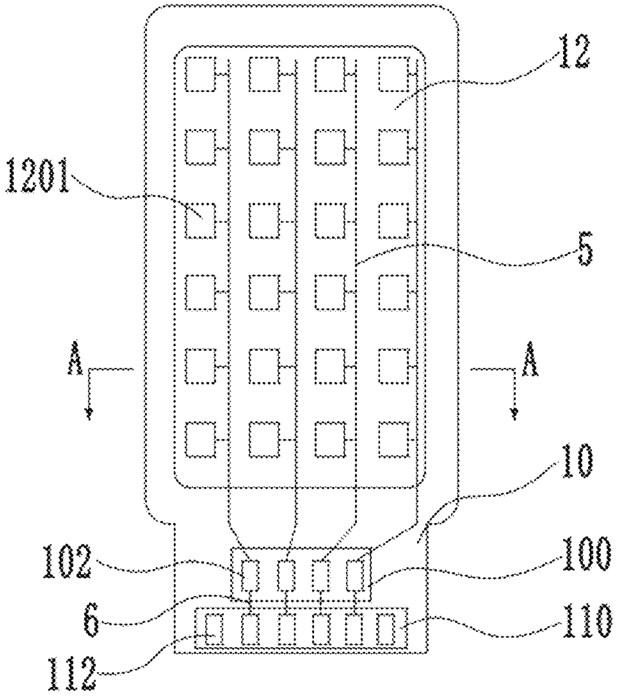
FIG. 2 is another schematic structural diagram of a display device involved in an embodiment of the present disclosure.
Figure 3:
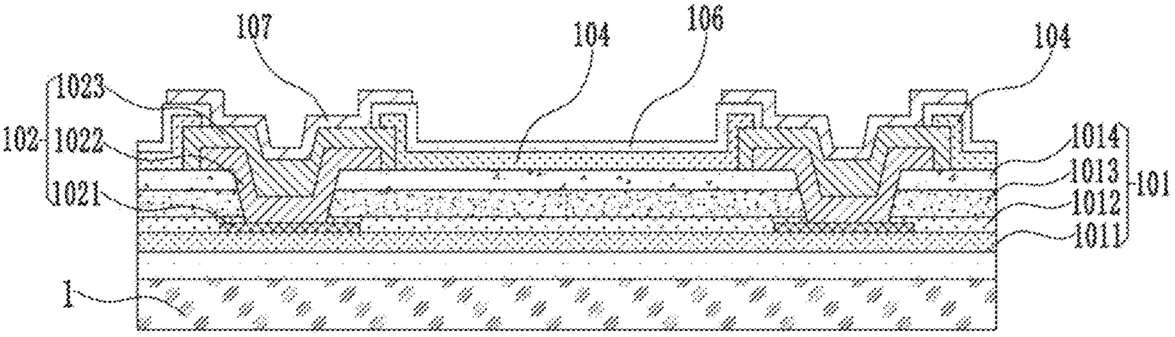
FIG. 3 is a schematic structural diagram of a first region of a display panel involved in an embodiment of the present disclosure.

As shown in FIGS. 1 to 3, an exemplary embodiment of the present disclosure proposes a display panel. The display panel is provided with a display area 12 and a non-display area 10 connected to the display area 12. The non-display area is provided with a chip pin connection region. The chip pin connection region is defined as a first region. The display panel includes a substrate 1, a plurality of sub-pixels 1201, a plurality of data lines 5, a first insulating layer set 101, a plurality of first pins 102, a first planarization layer 104, a first insulating layer 106, and a third metal layer 107. The plurality of the sub-pixels 1201 are located in the display area 12. The plurality of the data lines 5 are located in the display area 12 and the non-display area 10 and electrically connected to the plurality of the sub-pixels 1201. The first insulating layer set 101 is located at one side of the substrate 1. A portion of the first insulating layer set 101 in the first region is provided with a plurality of first openings located at intervals. The plurality of the first pins 102 are located in the plurality of first openings respectively and electrically connected to the plurality of the data lines 5. The first planarization layer 104 is located between two adjacent first pins 102. The first planarization layer 104 is located at one side of the first insulating layer set 101 away from the substrate 1 and partially covers one side of the first pin 102 away from the substrate 1. The first insulating layer 106 is located at one side of the first planarization layer 104 away from the substrate 1, covers the first planarization layer 104 and partially covers the first pin 102. The third metal layer 107 is located at the side of the first pin 102 away from the substrate 1 and partially covers the first insulating layer 106.

Peeling problems of the chip (integrated circuit, IC) are easily to happen on active-matrix organic light emitting diode (AMOLED) display panels with flexible multi-layer on cell (FMLOC) structures during the reliability verification process. That is, the outgassing phenomenon between the first planarization layer 104 and the first insulating layer 106 and between the first planarization layer 104 and the first insulating layer set 101 causes the first planarization layer 104 to peel off from the first insulating layer 106 and the first insulating layer set 101 in the reliability verification process, which leads to poor contact between the pin of the chip and the first pin 102, and generates a bright line in the high-temperature and high-humidity environment of reliability, which seriously affects the reliability of the display device.

Through analysis of the peeling off problems of the chip, the common causes are now the following categories.

First, the release of water vapor inside the display panel.

The first planarization layer 104 is easy to absorb water. Before setting the first insulating layer 106, the first planarization layer 104 absorbs the water vapor in the cleaning process and in the air, and the formation process of the first insulating layer 106 fixes part of the water vapor inside the display panel. In the high-temperature and high-humidity process of reliability, this part of the water vapor is released, causing the first insulating layer 106 to peel off from the first planarization layer 104, and resulting in the reliability peeling off problems of the chip.

Second, the intrusion of water vapor outside the display panel.

Figure 4:
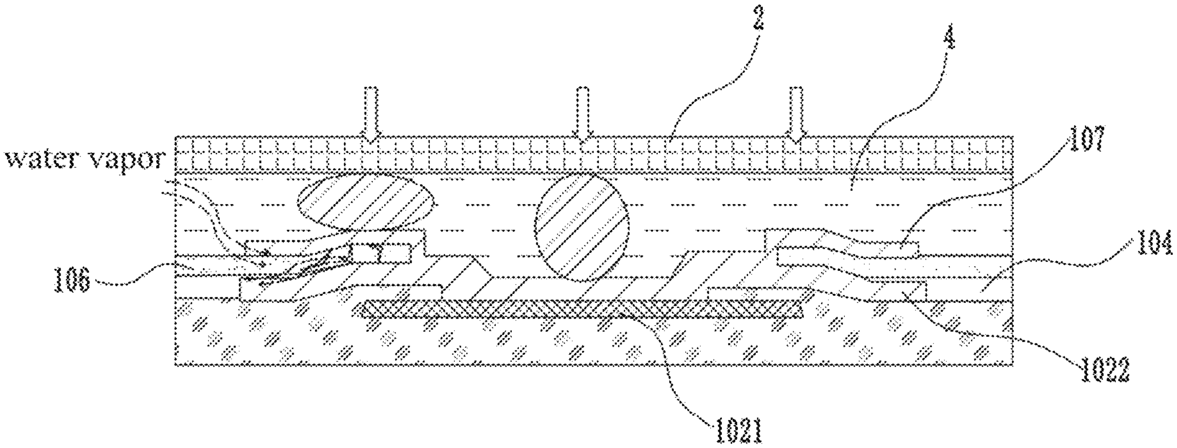
FIG. 4 is a schematic diagram of a display panel in a state when external water vapor intrudes involved in an embodiment of the present disclosure.

As shown in FIG. 4, the first planarization layer 104 cracks after being compressed by an external force. After a long period of high-temperature and high-humidity process of reliability, water vapor intrudes into the interior of the display panel through the cracks. With the diffusion of the water vapor, peeling off occurs between the first insulating layer 106 and the first planarization layer 104, resulting in defects such as the bright line of reliability.

Third, the internal and external water vapor acts together.

After the first planarization layer 104 is compressed by conductive particles of the anisotropic conductive film (ACF) and the like, the first planarization layer 104 is pulled, and in the high-temperature and high-humidity environment of reliability, the outgassing of the internal water vapor opens up the path of water vapor. The first planarization layer 104 expands and produces cracks after the intrusion of the external water vapor, resulting in the peeling off of the film layers and defects such as the bright line of reliability.

Combining the above failure modes, the peeling off of the film layers is mainly concentrated among the first planarization layer 104, the first insulating layer set 101 and the first insulating layer 106. In order to prevent the reliability peeling off problems of the chip, the adhesion force between the first planarization layer 104 and the first insulating layer 106, and between the first planarization layer 104 and the first insulating layer set 101 needs to be improved.

Figure 5:
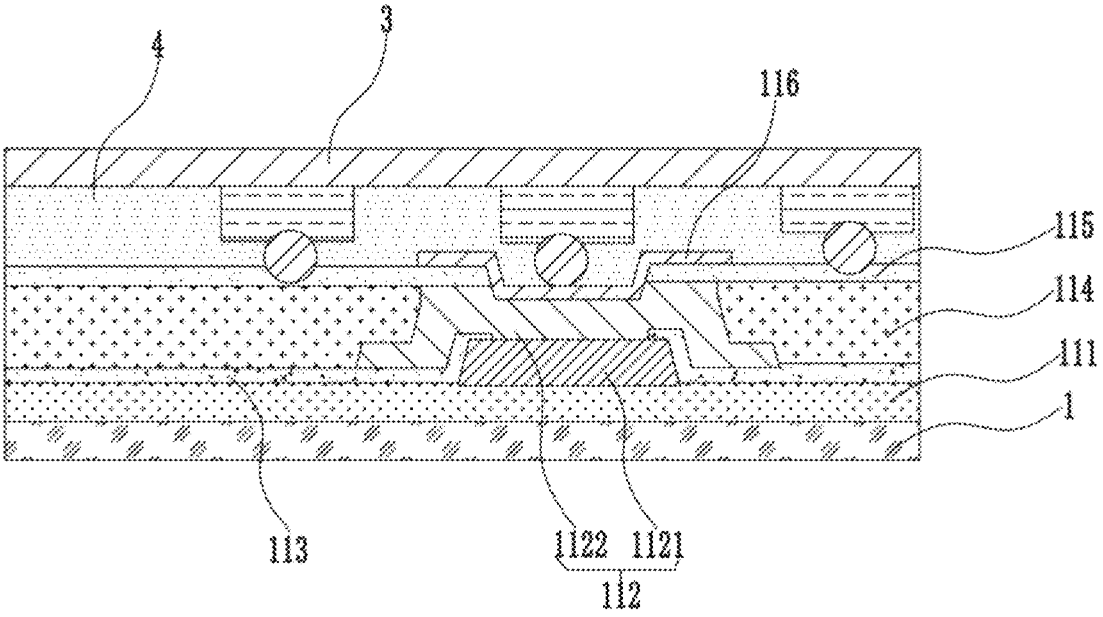
FIG. 5 is a schematic structural diagram of a second region of a display panel involved in an embodiment of the present disclosure.

The non-display area 10 is provided with a pin connection region of the circuit board. The pin connection region of the circuit board is defined as a second region 110. As shown in FIGS. 2 and 5, in the second region 110, the display panel further includes a second insulating layer set 111, a plurality of second pins 112, a second protection layer 113, a second planarization layer 114, a second insulating layer 115, and a fifth metal layer 116. The second insulating layer set 111 is located at a same side of the substrate 1 as the first insulating layer set 101. The plurality of the second pins 112 are located at one side of the second insulating layer set 111 away from the substrate 1. The plurality of the second pins 112 are connected to the first pins 102 through a plurality of connecting lines 6. The second protection layer 113 is located at the side of the second insulating layer set 111 away from the substrate 1 and between two adjacent second pins 112. The second planarization layer 114 is located at the side of the second protection layer 113 away from the substrate 1. The second insulating layer 115 is located at one side of the second planarization layer 114 away from the substrate 1 and located in a partial area at one side of the second pin 112 away from the substrate 1. The fifth metal layer 116 is located at the side of the second pin 112 away from the substrate 1. The fifth metal layer 116 completely covers the second pin 112. A portion of the fifth metal layer 116 is located at the side of the second insulating layer 115 away from the substrate 1.

Figure 6:
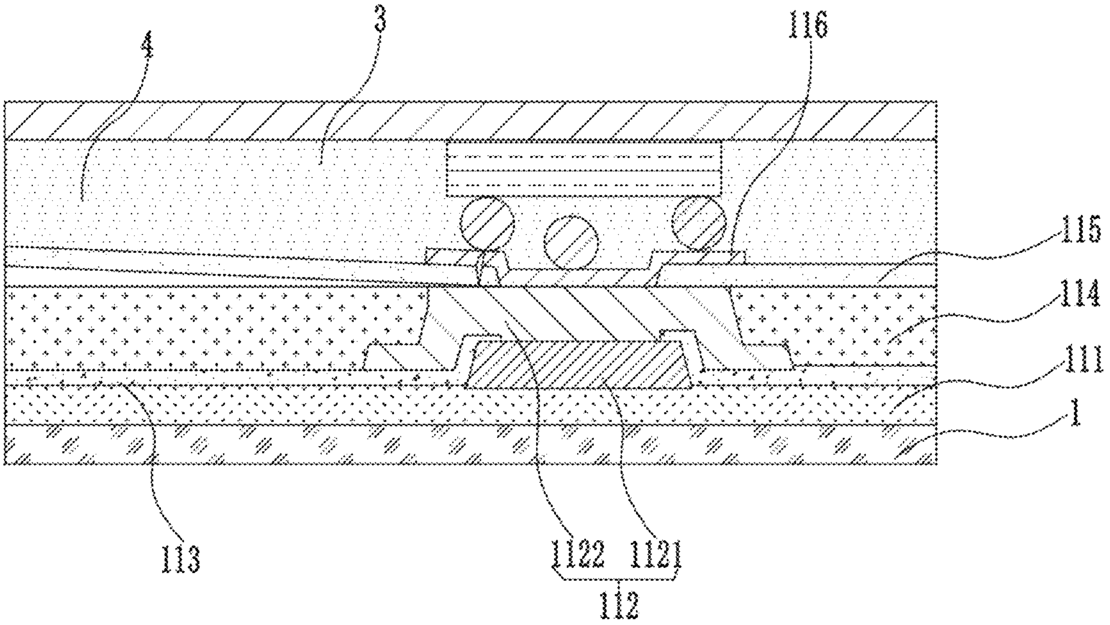
FIG. 6 is a schematic diagram of a second insulating layer in a state when the second insulating layer is cracked by conductive particles involved in an embodiment of the present disclosure.

It can be seen that because of the parallel design between the second protection layer 113 and the second planarization layer 114, the peeling off between the second protection layer 113 and the second planarization layer 114 is easily generated after the entry of water vapor, a channel is formed between two adjacent second pins 112 after the peeling off, and the residual metal film layer thereof may migrate to lead to a short-circuit between the second pins 112, which leads to the failure of the display panel. In addition, as shown in FIG. 6, the fifth metal layer 116 is stacked on the second pin 112 and the second insulating layer 115. Due to the segment difference between the second insulating layer 115 and the second pin 112, the middle position of the second pin 112 is lower than the edge position of the second pin 112. During the binding process, the conductive particles of the ACF are pressed at a higher position, causing the second insulating layer 115 to be cracked. During the reliability process, the intrusion of water vapor leads to increased peeling off and corrosion of the lead line.

It can be understood that the problems mentioned above can still exist when the chip and the circuit board are connected by using pins in the same region.

Figure 7:
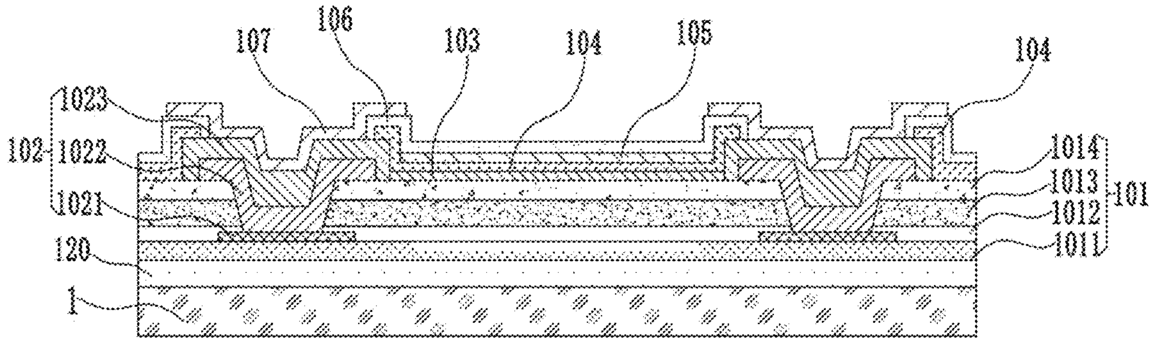
FIG. 7 is a schematic structural diagram of a first region of a display panel involved in an embodiment of the present disclosure.

Based on these, an exemplary embodiment of the present disclosure provides a display panel. As shown in FIG. 7, the display panel is provided with a display area 12 and a non-display area 10 at least located at one side of the display area 12. The non-display area 10 includes a first region 100. The display panel includes a substrate 1, a plurality of sub-pixels 1201, a plurality of data lines 5, a first insulating layer set 101, a plurality of first pins 102, a first metal layer 103, a first planarization layer 104, and a second metal layer 105. The plurality of the sub-pixels 1201 are located in the display area 12. The plurality of the data lines S are located in the display area 12 and the non-display area 10 and electrically connected to the plurality of the sub-pixels 1201. The first insulating layer set 101 is located at one side of the substrate 1. The first insulating layer set 101 is provided with a plurality of first openings, and the plurality of the first openings are located at intervals in the first region. The plurality of the first pins 102 are located in the plurality of the first openings in a corresponding manner and electrically connected to the plurality of the data lines 5. The first metal layer 103 is located between two adjacent first pins 103 and electrically insulated from the two adjacent first pins 102. The first planarization layer 104 is located at one side of the first metal layer 103 away from the substrate 1. The second metal layer 105 is located at one side of the first planarization layer 104 away from the substrate 1 and electrically insulated from the two adjacent first pins 102.

The first insulating layer set 101 may generally include SiOx and SiNx. The first insulating layer 106 is generally SiNx. The first pin 102 generally includes a second electrode portion 1024. The second electrode portion 1024 may be provided in a same layer and formed in a same material as the source drain (SD), and thus the first electrode portion 1021 is generally a metal, for example, Ti or Al. To define the magnitude of the adhesion force between the first planarization layer 104 (PLN1) and the first insulating layer set 101 (SiOx and SiNx), the magnitude of the adhesion force between the first planarization layer (PLN1) 104 and the first insulating layer 106 (SiNx) and the magnitude of the adhesion force between the first planarization layer (PLN1) and the first pin 102, pullout force tests are conducted between PLN1 and SiOx, PLN1 and SiNx, and PLN1 and SD. SiOx and PLN1, SiNx and PLN1, and SD and PLN1 are respectively fabricated on bare glass to form a plurality of samples for testing. The samples are taken and put into a reliability test, and the pullout force tests are performed using a strength tester before reliability, at 120 Hr of reliability, and at 240 Hr of reliability, to confirm the adhesion force of different interlayer pairings after experiencing the conditions of reliability.

Figure 8:
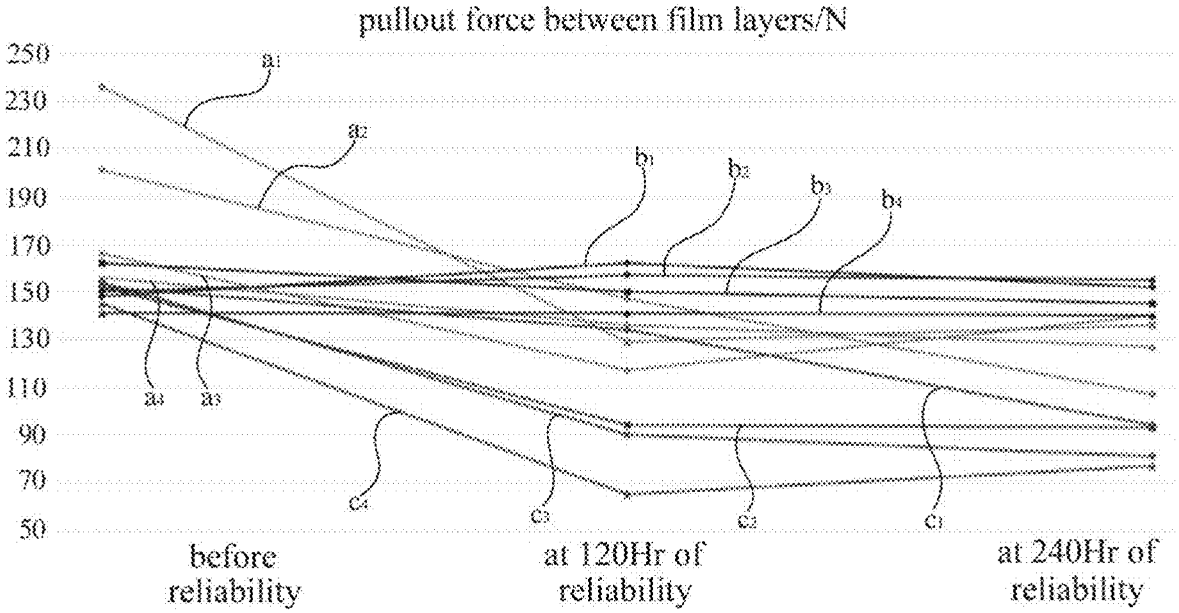
FIG. 8 shows a change in adhesion force between different film layers in the first region of the display panel after experiencing a reliability condition involved in an embodiment of the present disclosure.

As seen by lines c1, c2, c3, and c4 in FIG. 8, the adhesion force between SD and PLN1 does not change significantly after experiencing 240 Hr of reliability. As seen by lines a1, a2, a3, and a4, the adhesion force between SiOx and PLN1 undergoes a significant decrease. As seen by lines b1, b2, b3, and b4, the adhesion force between SiNx and PLN1 undergoes a significant decrease. In addition, it should be clarified that the adhesive force of the square adhesive used during the pullout force tests is limited, and part of samples do not experience peeling off of film layers after the square adhesive is deformed and peeled off. All the samples of SD and PLN1 do not experience peeling off before and after reliability. The vast majority of the samples of SiOx-PLN1 and SiNx-PLN1 experience peeling off after 240 Hr of reliability. That is, after experiencing 240 Hr of reliability, the adhesion force between SD and PLN1>the adhesion force between SiOx and PLN1>the adhesion force between SiNx and PLN1.

The first metal layer 103 is located between two adjacent first pins 102 and located at the side of the first insulating layer set 101 away from the substrate 1. The first planarization layer 104 is located at the side of the first metal layer 103 away from the substrate 1, and the second metal layer 105 is located at the side of the first planarization layer 104 away from the substrate 1. The adhesion force between the first planarization layer 104 and the metal material is greater than that between the first planarization layer 104 and the inorganic material. The first metal layer 103 and the second metal layer 105 are located on two sides of the first planarization layer 104 respectively, which strengthens the bonding force of the first planarization layer 104 and the film layers at opposite sides of the first planarization layer 104, reduces or even eliminates the possibility of the peeling off of the first planarization layer 104 from the film layers at opposite sides of the first planarization layer 104, and reduces or avoids the poor contact between the pin of the electronic devices to be connected and the first pin 102.

Figure 9:
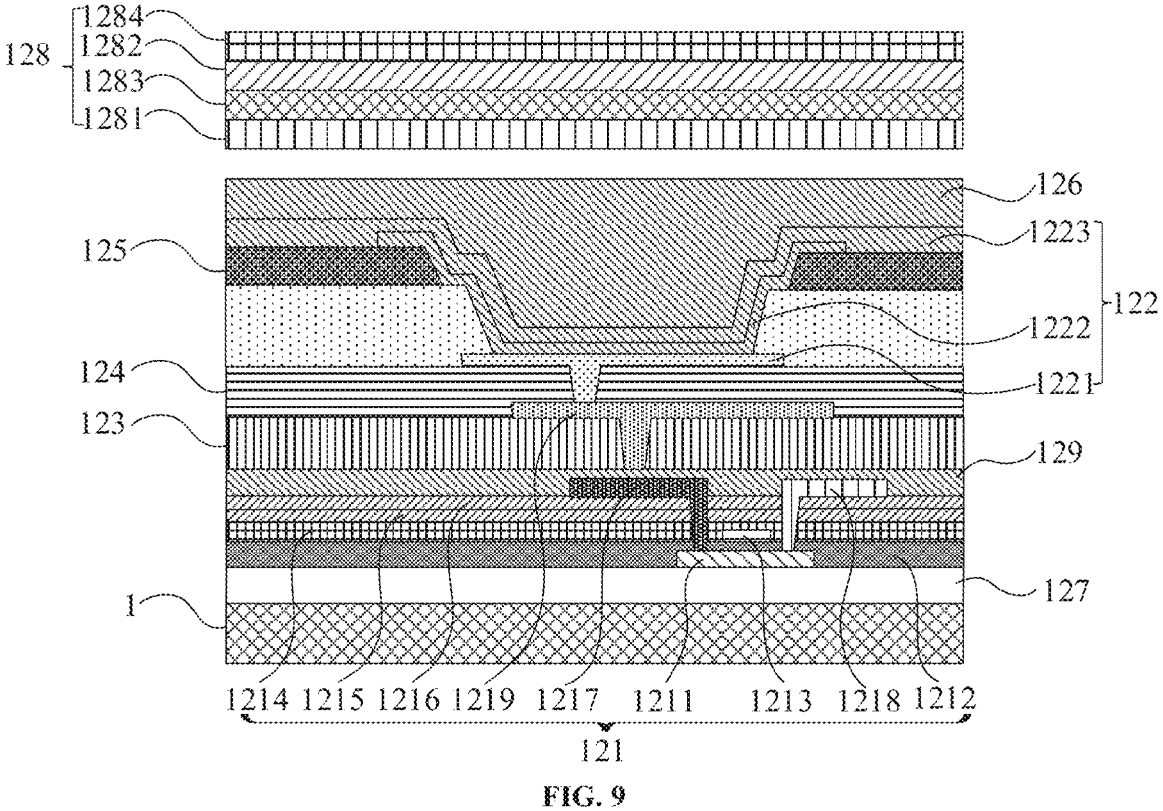
FIG. 9 is a cross-sectional view along A-A of a display panel involved in an embodiment of the present disclosure.
Figure 10:
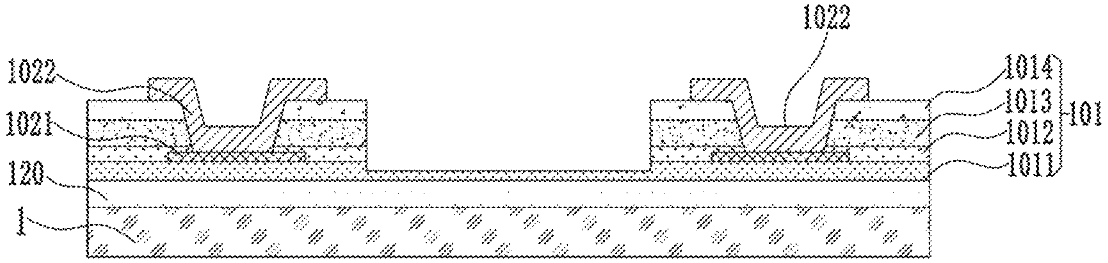
FIGS. 10 to 14 are schematic diagrams of a preparation process of another structure of a first region of a display panel involved in an embodiment of the present disclosure.
Figure 11:
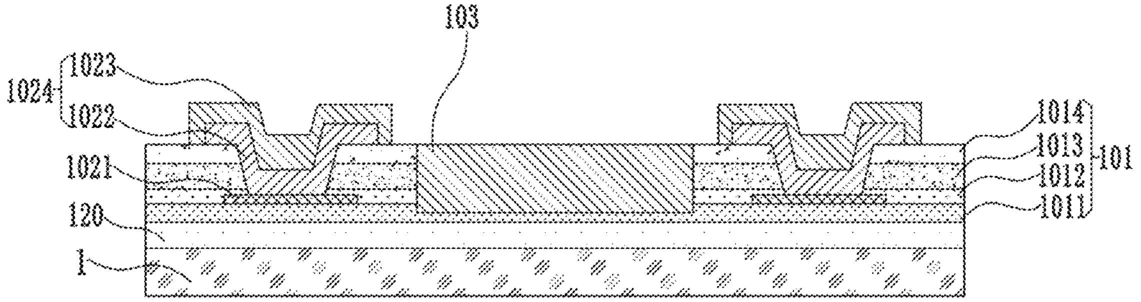
Figure 12:
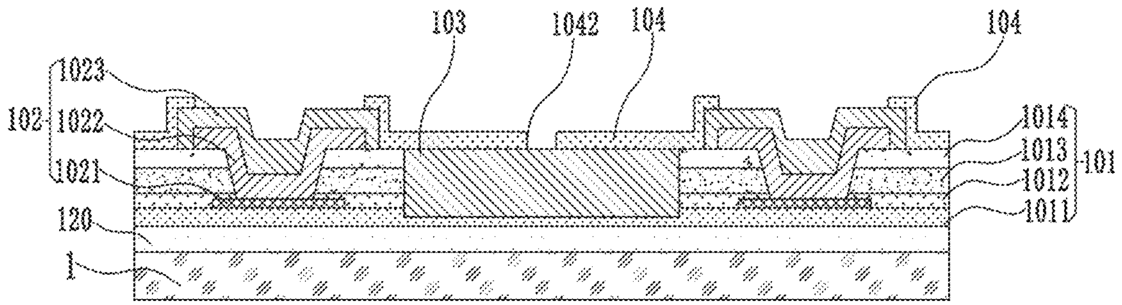
Figure 13:
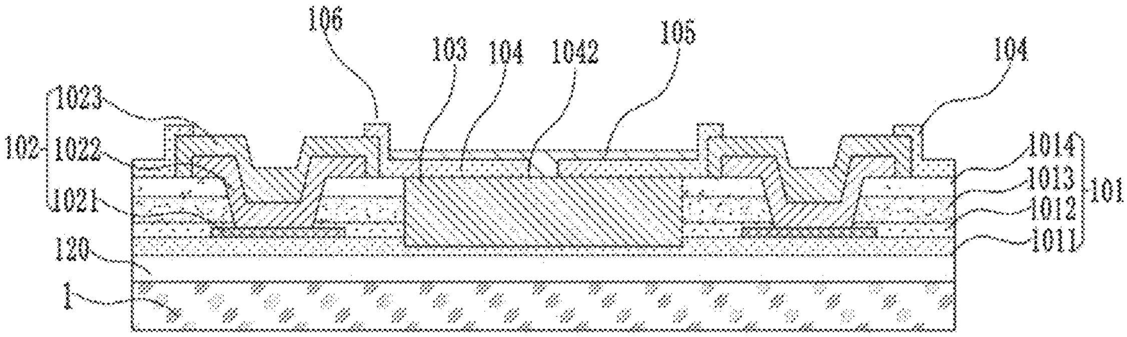
Figure 14:
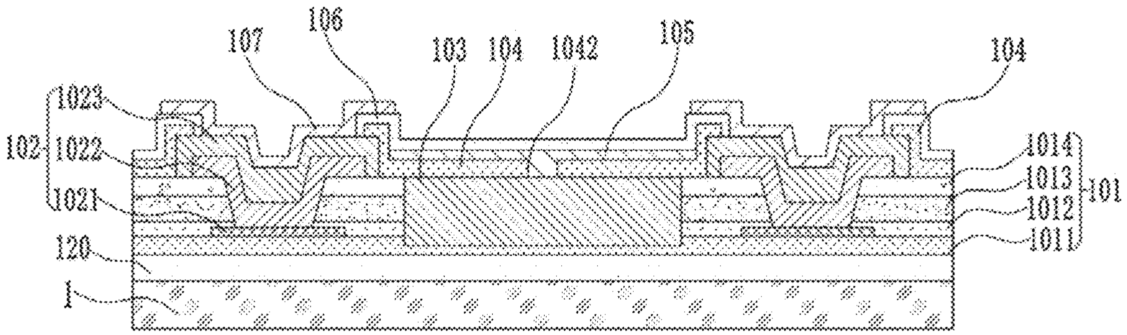

As shown in FIG. 9, a display layer set is provided in the display area of the display panel. The display layer set includes an array substrate and a light emitting layer 122. The array substrate is located at one side of the substrate 1. The light emitting layer 122 is located at one side of the array substrate away from the substrate 1. Light emitting units distributed in an array may be provided at the light emitting layer 122.

A third planarization layer 123 is provided between the array substrate and the light emitting layer 122. A fourth planarization layer 124 may be provided at one side of the third planarization layer 123 away from the substrate 1. A pixel defining layer 125 may be provided at one side of the fourth planarization layer 124 away from the substrate 1.

The display layer set is located on the substrate 1, and may be directly stacked on a surface of the substrate 1; or a buffer layer 127 may be provided on the surface of the substrate 1, and the display layer set may be stacked on a surface of the buffer layer 127 away from the substrate 1. The buffer layer 127 is formed in an insulation material.

The array substrate may include a plurality of thin film transistors 121. The thin film transistors 121 may be of a top-gate type or a bottom-gate type. Taking the thin film transistors of the top-gate type as an example, the thin film transistor 121 may include an active layer 1211, a gate insulating layer 1212, a gate 1213, and a source drain.

The active layer 1211 is located at one side of the substrate 1. The material of the active layer 1211 may be polycrystalline silicon, amorphous silicon, etc. The active layer 1211 may include a channel region and two doped regions of different doping types located at two sides of the channel region.

The gate insulating layer 1212 may cover the active layer 1211 and the substrate 1. The gate insulating layer 1212 is made of an insulation material such as silicon oxide.

The gate 1213 is located at one side of the gate insulating layer 1212 away from the substrate 1 and directly opposite the active layer 1211, i.e., a projection of the gate 1213 on the substrate 1 is located within a projection of the active layer 1211 on the substrate 1. For example, the projection of the gate 1213 on the substrate 1 coincides with a projection of the channel region of the active layer 1211 on the substrate 1.

The thin film transistor 121 further includes an interlayer insulating layer 1214 and an interlayer dielectric layer 1219. The interlayer insulating layer 1214 covers the gate 1213 and the gate insulating layer 1212. The thin film transistor 121 further includes a first interlayer dielectric layer 1215 and a second interlayer dielectric layer 1216. The first interlayer dielectric layer 1215 covers the interlayer insulating layer 1214. The second interlayer dielectric layer 1216 is located at one side of the first interlayer dielectric layer 1215 away from the substrate 1. The interlayer insulating layer 1214, the first interlayer dielectric layer 1215, and the second interlayer dielectric layer 1216 are insulation materials. The material of the first interlayer dielectric layer 1215 and the material of the second interlayer dielectric layer 1216 may be the same, but the material of the interlayer insulating layer 1214 may be different from the material of the first interlayer dielectric layer 1215 or the material of the second interlayer dielectric layer 1216.

The source drain is located on a surface of the interlayer dielectric layer 1219 away from the substrate 1. The source drain includes a first source 1217 and a drain 1218. The first source 1217 and the drain 1218 are connected to the active layer 1211, for example, the first source 1217 and the drain 1218 are connected to a corresponding one of the two doped regions of the active layer 1211 through a via, respectively.

The source drain may include the first source 1217. The third planarization layer 123 is located at one side of the source drain away from the substrate 1. A surface of the third planarization layer 123 away from the substrate 1 is a plane. The source drain may further include the second source 1219. The second source 1219 is connected to the first source 1217. A fifth planarization layer is provided at one side of the second source 1219 away from the substrate 1. The fifth planarization layer covers the second source 1219 and the third planarization layer 123. A protection layer may further be provided at one side of the first source 1217 away from the substrate 1. The protection layer covers the first source 1217 and the drain 1218. The third planarization layer 123 covers the third protection layer 129.

The display panel may further include a light emitting unit layer. The light emitting unit layer is located at one side of the third planarization layer 123 away from the array substrate or located at one side of the fourth planarization layer 124 away from the array substrate. The light emitting unit layer may include a plurality of light emitting units. Each of the light emitting units may include a first electrode 1221, a light emitting element 1222 and a second electrode 1223. The first electrode 1221 is located on a surface of the array substrate away from the substrate 1. The light emitting element 1222 is located on a surface of the first electrode 1221 away from the substrate 1. The second electrode 1223 is located on a surface of the light emitting element 1222 away from the substrate 1. The light emitting layer 122 may be driven by the first electrode 1221 and the second electrode 1223 to emit light to display an image.

The first electrode 1221 is connected to the first source 1217 or the second source 1219. The pixel defining layer 125 is provided at one side of the first electrode 1221 away from the substrate 1. When the thin film transistor 121 includes only the first source 1217, the first electrode 1221 is connected to the first source 1217, and the pixel defining layer 125 is provided to cover the first electrode 1221 and the third planarization layer 123. When the thin film transistor 121 further includes the second source 1219, the first electrode 1221 is connected to the second source 1219, and the pixel defining layer 125 is provided to cover the first electrode 1221 and the fourth planarization layer 124.

The second electrode 1223 may serve as a cathode and the first electrode 1221 may serve as an anode. The light emitting element 1222 may be driven to emit light by application of a signal to the first electrode 1221, and the specific light emitting principle is not described in detail herein. The light emitting element 1222 may include an electroluminescent organic material and may be formed by using a process such as vaporization. For example, the light emitting element 1222 may include a hole injection layer, a hole transmission layer, a light generation layer, an electron transmission layer, and an electron injection layer sequentially stacked on the first electrode 1221 layer.

In addition, the display panel of the present disclosure may further include an encapsulation layer 126, which may be provided at the light emitting unit. The encapsulation layer 126 is located at one side of the light emitting layer 122 away from the substrate 1, so as to encapsulate the light emitting layer and prevent the erosion of water and oxygen. The encapsulation layer may be a single-layer or multi-layer structure. The material of the encapsulation layer may include organic or inorganic material, and is not specifically limited herein.

The display area 12 further includes a touch control layer 128. The touch control layer 128 may be mutual capacitance touch control. The touch control layer 128 includes a first touch control layer 1281 and a second touch control layer 1282. The first touch control layer 1281 is a metal mesh (MM) layer, and the second touch control layer 1282 is a bridge metal (BM) layer. The metal mesh is located in the display area. The metal mesh may be divided into a touch-driving (Tx) metal mesh and a touch-sensitive (Rx) metal mesh according to the horizontal and vertical directions. One of the touch-sensitive (Rx) metal mesh and the touch-driving (Tx) metal mesh is connected to each other, and the other is connected through the bridge metal layer. A first touch control insulating layer 1283 is provided at one side of the first touch control layer 1281 away from the substrate 1, and a second touch control insulating layer 1284 is provided at one side of the second touch control layer 1282 away from the substrate 1.

As shown in FIGS. 10 to 14, the first insulating layer set 101 is located in the first region. The first insulating layer set 101 is located at one side of the substrate 1. The first insulating layer set 101 includes a first insulating sub-layer 1011, a second insulating sub-layer 1012, a third insulating sub-layer 1013, and a fourth insulating sub-layer 1014. The first pin 102 is located in the first opening of the first insulating layer set 101. The first pin 102 includes a first electrode portion 1021 and a second electrode portion 1024. In addition, it should be illustrated that a buffer layer 120 may be provided between the substrate 1 and the first insulating layer set 101.

The first insulating sub-layer 1011 is located at one side of the substrate 1. The first electrode portion 1021 is located at one side of the first insulating sub-layer 1011 away from the substrate 1. The second insulating sub-layer 1012 is located at the side of the first insulating sub-layer 1011 away from the substrate 1. The third insulating sub-layer 1013 is located at one side of the second insulating sub-layer 1012 away from the substrate 1. The fourth insulating sub-layer 1014 is located at one side of the third insulating sub-layer 1013 away from the substrate 1. The second insulating sub-layer 1012 is provided with a first through-hole. The third insulating sub-layer 1013 is provided with a second through-hole. The fourth insulating sub-layer 1014 is provided with a third through-hole. The first through-hole, the second through-hole, and the third through-hole are arranged coaxial. The first through-hole, the second through-hole, and the third through-hole are sequentially increasing in diameter to form the tapered first opening.

Orthographic projections, on the substrate 1, of the first through-hole, the second through-hole, and the third through-hole are all located within an orthographic projection, on the substrate 1, of the first electrode portion 1021. The second electrode portion 1024 includes a first conductive portion 1022 and a second conductive portion 1023. The first conductive portion 1022 is located in the first opening. A portion of the first conductive portion 1022 is located at the side of the first insulating layer set 101 away from the substrate 1. The second conductive portion 1023 completely covers the first conductive portion 1022. A portion of the second conductive portion 1023 is located at the side of the first insulating layer set 101 away from the substrate 1.

A first groove is formed by etching the first insulating layer set 101 between two adjacent first pins 102. The first metal layer 103 is located in the first groove, which may narrow the segment difference between the first metal layer 103 and the first insulating layer set 101. The fourth insulating sub-layer 1014, the third insulating sub-layer 1013 and the second insulating sub-layer 1012 are fully etched and penetrated, and the first insulating sub-layer 1011 is partially etched but not penetrated. The first metal layer 103 is filled in the first groove, and one side of the first metal layer 103 away from the substrate 1 is flush with the fourth insulating sub-layer 1014. The first metal layer 103 may be provided in a same layer and formed in a same material as the second conductive portion 1023.

The first planarization layer 104 is located at the side of the first metal layer 103 away from the substrate 1 and covers the first insulating layer set 101. A portion of the first planarization layer 104 is located at one side of the second conductive portion 1023 away from the substrate 1. The second metal layer 105 is located at the side of the first planarization layer 104 away from the substrate 1. It should be illustrated that an orthographic projection of the second metal layer 105 on the substrate 1 may be larger than an orthographic projection of the first metal layer 103 on the substrate 1 and smaller than an orthographic projection of the first planarization layer 104 on the substrate 1. Of course, the second metal layer 105 may also completely cover the first planarization layer 104, provided that a disconnection between the second metal layer 105 and the second conductive portion 1023 is ensured to prevent a short-circuit between the second metal layer 105 and the second conductive portion 1023. Preferably, a spacing between the orthographic projection of the second metal layer 105 on the substrate 1 and the orthographic projection of the second conductive portion 1023 on the substrate 1 is equal to a thickness of the first planarization layer 104. This better ensures the bonding force between the second metal layer 105 and the planarization layer and prevents a short-circuit between the second metal layer 105 and the first pin 102.

The first planarization layer 104 is provided with a first disconnection region 1042 exposing the first metal layer 103, and the second metal layer 105 passes through the first disconnection region 1042 and is connected to the first metal layer 103. This may help release the pressure of the conductive particles of the ACF on the first planarization layer 104 during the binding process of the chip, and prevent the first planarization layer 104 from deforming to produce cracks. In addition, the first metal layer 103 is in contact with the second metal layer 105, which may further enhance the bonding force between the two sides of the planarization layer and the metal layers, further reduce the possibility of the peeling off of the first planarization layer 104 from the film layers at opposite sides of the first planarization layer 104, and reduce the poor contact between the pin of the chip and the first pin 102.

When the first pin 102 is used to connect to the chip, the display panel may further include a first insulating layer 106. The first insulating layer 106 is located at one side of the second metal layer 105 away from the substrate 1 and completely covers the second metal layer 105 and the first planarization layer 104. Edge of the first insulating layer 106 is connected to the side of the second conductive portion 1023 away from the substrate 1. The possibility of a short-circuit between the second metal layer 105 and the first pin 102 due to ion migration is blocked by the first insulating layer 106. The display panel may further include a third metal layer 107. The third metal layer 107 is located at the side of the second conductive portion 1023 away from the substrate 1. A portion of the third metal layer 107 is located at one side of the first insulating layer 106 away from the substrate 1. The provision of the third metal layer 107 may increase the contact area between the first pin 102 and the pin of the chip, and reduce the poor contact between the first pin 102 and the pin of the chip.

Figure 15:
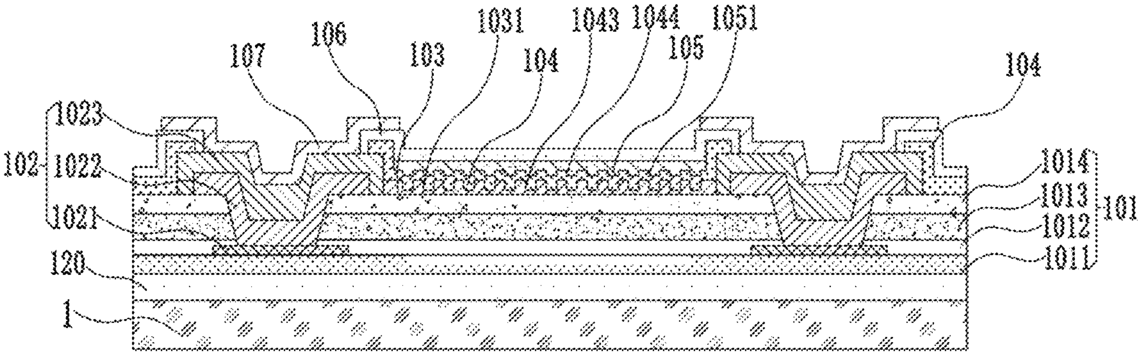
FIG. 15 is yet another schematic structural diagram of a first region of a display panel involved in an embodiment of the present disclosure.

As shown in FIG. 15, a third recess 1031 is arranged at the side of the first metal layer 103 away from the substrate 1, a third protrusion 1043 is arranged at one side of the first planarization layer 104 close to the substrate 1, and the third protrusion 1043 is filled in the third recess 1031, which increases the contact area between the first metal layer 103 and the first planarization layer 104, thereby further enhancing the bonding force between the first metal layer 103 and the first planarization layer 104. A fourth recess 1044 is arranged at the side of the first planarization layer 104 away from the substrate 1, a fourth protrusion 1051 is arranged at one side of the second metal layer 105 close to the substrate 1, and the fourth protrusion 1051 is filled in the fourth recess 1044, which increases the contact area between the second metal layer 105 and the first planarization layer 104, thereby further enhancing the bonding force between the second metal layer 105 and the first planarization layer 104. By further enhancing the bonding force between the first planarization layer 104 and the film layers at opposite sides of the first planarization layer 104, the possibility of peeling off of the first planarization layer 104 from the film layers at opposite sides of the first planarization layer 104 is further reduced, and the poor contact between the pin of the chip and the first pin 102 is reduced or avoided.

Figure 16:
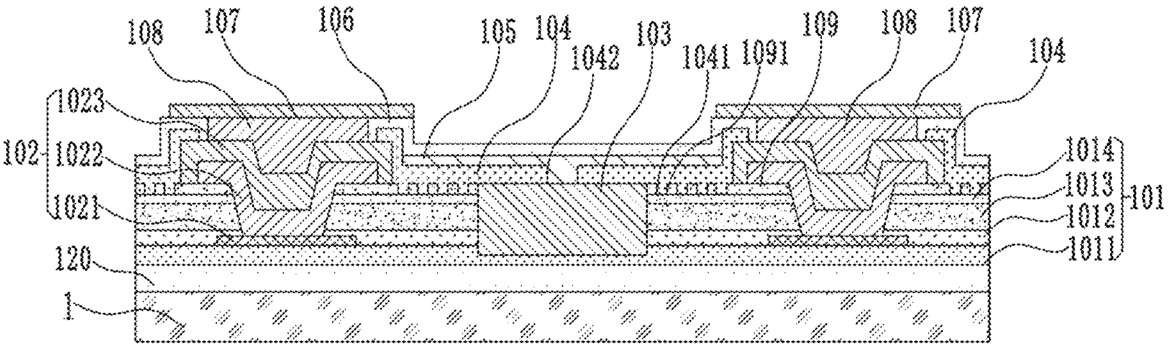
FIG. 16 is yet another schematic structural diagram of a first region of a display panel involved in an embodiment of the present disclosure.

As shown in FIG. 16, the display panel may further include a fourth metal layer 108. The fourth metal layer 108 is located between the first pin 102 and the third metal layer 107. Specifically, the fourth metal layer 108 is located between the second conductive portion 1023 and the third metal layer 107. One side of the fourth metal layer 108 away from the substrate 1 is flush with the side of the first insulating layer 106 away from the substrate 1. The filling of the fourth metal layer 108 makes the third metal layer 107 into a relatively flat film, reduces the risk of the conductive particles of the ACF cracking the first insulating layer 106, and reduces the risk of the first insulating layer 106 peeling off from the first planarization layer 104, thereby effectively reducing the risk of the peeling off of the chip in the process.

The display panel may further include a first protection layer 109. The first protection layer 109 is located at the side of the first insulating layer set 101 away from the substrate 1 and located between the first metal layer 103 and the first pin 102. A first recess 1091 is arranged at one side of the first protection layer 109 away from the substrate 1, the first planarization layer 104 is provided with a first protrusion 1041 matching the first recess 1091, and the first protrusion 1041 is filled in the first recess 1091. The first recess 1091 may pass through the first protection layer 109, and the first protrusion 1041 passes through the first recess 1091 and is connected to the first insulating layer set 101. Specifically, the first protrusion 1041 passes through the first recess 1091 and is connected to the fourth insulating sub-layer 1014. The provision of the first recess 1091 and the first protrusion 1041 increases the contact area of the first protection layer 109 with the first planarization layer 104 and the first conductive portion 1022, which may effectively improve the adhesion force between the pin of the chip and the first pin 102, and reduce the risk of peeling off of the chip. Even in the case of the first planarization layer 104 peeling off from the first insulating layer set 101 and the first protection layer 109, the migration path channel of ions may be extended, reducing the occurrence of a short-circuit between two adjacent first pins 102 in the chip pin connection region due to ion migration.

It should be illustrated that the first recess 1091 may include a plurality of strip-shaped grooves distributed in parallel, and the first protrusion 1041 includes convex bars being in one-to-one correspondence with each of the strip-shaped grooves. The convex bar is filled the strip-shaped groove. Along a direction perpendicular to an extension direction of the strip-shaped groove, the strip-shaped groove may be provided with a rectangular, curved or triangular cross-sectional shape, and the convex bar is provided with a rectangular, curved or triangular cross-sectional shape matching the cross-sectional shape of the strip-shaped groove. Along the extension direction of the strip-shaped groove, an outer contour of the strip-shaped groove may be a straight line or may be provided as a curve, here the curve may be a wavy line. The first recess 1091 may include a plurality of dot-shaped recessing portions distributed in an array, and the first protrusion 1041 includes protrusions being in one-to-one correspondence with each of the dot-shaped recessing portions. The protrusion is filled in the dot-shaped recessing portion. The dot-shaped recessing portion may be provided with a prismatic, spherical-cap or prismatic cone shape, and the protrusion may be provided with a prismatic, spherical-cap or prismatic cone shape matching the shape of the dot-shaped recessing portion.

It should be illustrated that the first insulating sub-layer 1011 may be provided in a same layer and formed in a same material as the first gate insulating layer 1212. The second insulating sub-layer 1012 may be provided in a same layer and formed in a same material as the interlayer insulating layer 1214. The third insulating sub-layer 1013 may be provided in a same layer and formed in a same material as the first interlayer dielectric layer 1218. The fourth insulating sub-layer 1014 may be provided in a same layer and formed in a same material as the second interlayer dielectric layer 1216. The first electrode portion 1021 may be provided in a same layer and formed in a same material as the gate 1213. The first conductive portion 1022 may be provided in a same layer and formed in a same material as the first source 1217 and the drain 1218. The second conductive portion 1023 may be provided in a same layer and formed in a same material as the second source 1219. The first planarization layer 104 may be provided in a same layer and formed in a same material as the fourth planarization layer 124. The first insulating layer 106 may be provided in a same layer and formed in a same material as the first touch control insulating layer 1283. The third metal layer 107 may be provided in a same layer and formed in a same material as the second touch control layer 1282.

Figure 17:
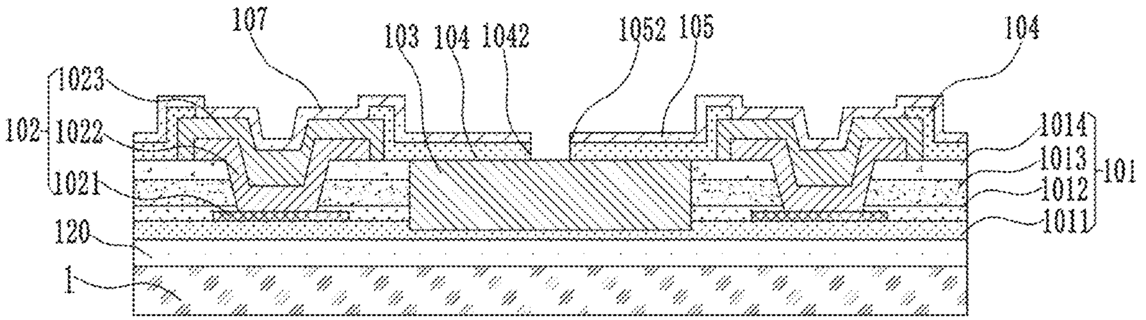
FIG. 17 is yet another schematic structural diagram of a first region of a display panel involved in an embodiment of the present disclosure.

As shown in FIG. 17, an exemplary embodiment of the present disclosure provides a display panel. A preparation process of this display panel may be seen in FIGS. 10 to 14. The difference from the display panel described above is that the second metal layer 105 of this display panel covers one side of the first planarization layer 104 away from the substrate 1, and covers one side of the first pin 102 away from the substrate 1. The first planarization layer 104 is provided with a first disconnection region 1042, the second metal layer 105 is provided with a second disconnection region 1052, and an orthographic projection of the second disconnection region 1052 on the substrate 1 is located within an orthographic projection of the first disconnection region 1042 on the substrate 1. The second metal layer 105 may increase the contact area between the first pin 102 and the pin of the chip and reduce the poor contact between the first pin 102 and the pin of the chip. A short-circuit between two adjacent first pins 102 is effectively prevented by the second disconnecting region 1052.

Figure 18:
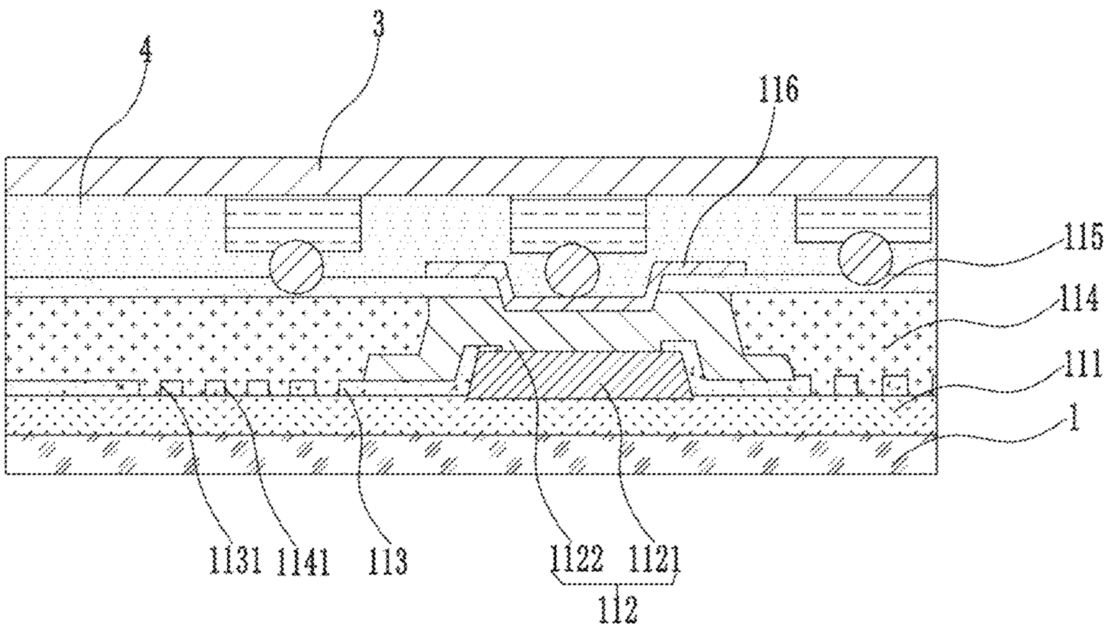
FIG. 18 is a schematic structural diagram of a second region of a display panel involved in an embodiment of the present disclosure.

When pins of a different region are used to connect with the circuit board, as shown in FIG. 18, the non-display area of the display panel further includes a second region, and in the second region, the display panel further includes a second insulating layer set 111. The second insulating layer set Ill is located at a same side of the substrate 1 as the first insulating layer set 101. The second insulating layer set 111 includes a fifth insulating sub-layer, a sixth insulating sub-layer, a seventh insulating sub-layer, and an eighth insulating sub-layer arranged sequentially along a direction away from the substrate 1. The fifth insulating sub-layer is located at one side of the substrate 1. The sixth insulating sub-layer is located at one side of the fifth insulating sub-layer away from the substrate 1. The seventh insulating sub-layer is located at one side of the sixth insulating sub-layer away from the substrate 1. The eighth insulating sub-layer is located at one side of the seventh insulating sub-layer away from the substrate 1.

A plurality of second pins 112 are located at one side of the second insulating layer set 111 away from the substrate 1. The second pin 112 includes a third electrode portion. The third electrode portion includes a third conductive portion 1121 and a fourth conductive portion 1122. The third conductive portion 1121 is located at the side of the second insulating layer set 111 away from the substrate 1. A second protection layer 113 is located at the side of the second insulating layer set 111 away from the substrate 1. The second protection layer 113 covers the second insulating layer set 111. A portion of the second protection layer 113 is located at one side of the third conductive portion 1121 away from the substrate 1. The fourth conductive portion 1122 covers the third conductive portion 1121. A portion of the fourth conductive portion 1122 is located at one side of the second protection layer 113 away from the substrate 1. A second planarization layer 114 is located at the side of the second protection layer 113 away from the substrate 1. The second planarization layer 114 covers the second protection layer 113. A portion of the second planarization layer 114 is located at one side of the fourth conductive portion 1122 away from the substrate 1. One side of the second planarization layer 114 away from the substrate 1 is flush with one side of the fourth conductive portion 1122 away from the substrate 1. A second insulating layer 115 is located at the side of the second planarization layer 114 away from the substrate 1. The second insulating layer 115 covers the second planarization layer 114. The second insulating layer 115 is located in a partial area at one side of the second pin 112 away from the substrate 1.

The fifth insulating sub-layer is provided in a same layer and formed in a same material as the first gage insulating layer, i.e., the fifth insulating sub-layer may be provided in a same layer and formed in a same material as the first insulating sub-layer 1011. The sixth insulating sub-layer may be provided in a same layer and formed in a same material as the interlayer insulating layer 1214, i.e., the sixth insulating sub-layer may be provided in a same layer and formed in a same material as the second insulating sub-layer 1012. The seventh insulating sub-layer may be provided in a same layer and formed in a same material as the first interlayer dielectric layer 1215, i.e., the seventh insulating sub-layer may be provided in a same layer and formed in a same material as the third insulating sub-layer 1013. The fourth insulating sub-layer 1014, the eighth insulating sub-layer and the second interlayer dielectric layer 1216 are provided in a same layer and formed in a same material. That is, the eighth insulating sub-layer may be provided in a same layer and formed in a same material as the fourth insulating sub-layer 1014.

The first electrode portion 1021 is provided in a same layer and formed in a same material as the gate. The third conductive portion 1121 may be provided in a same layer and formed in a same material as the first source 1217 and the drain 1218. The fourth conductive portion 1122 may be provided in a same layer and formed in a same material as the second source 1219. The second protection layer 113 is provided in a same layer and formed in a same material as the third protection layer 129. The second planarization layer 114 may be provided in a same layer and formed in a same material as the fourth planarization layer 124. The fifth metal layer may be provided in a same layer and formed in a same material as the second touch control layer 1282. The sixth metal layer 117 may be provided in a same layer and formed in a same material as the first touch control layer 1281. The second insulating layer 115 may be provided in a same layer and formed in a same material as the first touch control insulating layer 1283, i.e., the second insulating layer 115 may be provided in a same layer and formed in a same material as the first insulating layer 106.

A second recess 1131 is arranged at one side of the second protection layer 113 away from the substrate 1, the second planarization layer 114 is provided with a second protrusion 1141 matching the second recess 1131, and the second protrusion 1141 is filled in the second recess 1131. It should be illustrated that the second recess 1131 may pass through the second protection layer 113, and the second protrusion 1141 is filled in the second recess 1131 and is connected to the second insulating layer set 111. Specifically, the second protrusion 1141 may be filled in the second recess 1131 and be connected to the eighth insulating sub-layer. The second protrusion 1141 and the second recess 1131 adopt similar or the same structural forms as those described above and will not be repeated herein.

The provision of the second recess 1131 and the second protrusion 1141 increases the contact area between the second protection layer 113 and the second planarization layer 104, which may effectively improve the adhesion force between the pin of the circuit board and the second pin 112, and reduce the risk of peeling off of the circuit board. Even in the case of the second planarization layer 114 peeling off from the first protection layer 109, the migration path channel of ions may be extended, reducing the occurrence of a short-circuit between two adjacent second pins 102 in the pin connection region of the circuit board due to ion migration.

Figure 19:
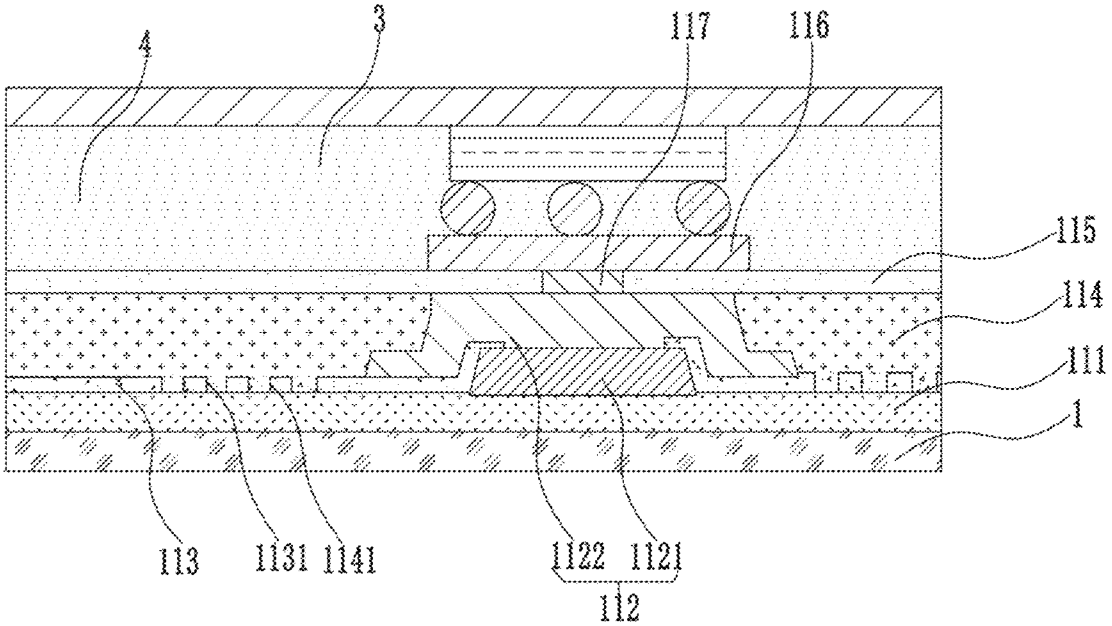
FIG. 19 is another schematic structural diagram of a second region of a display panel involved in an embodiment of the present disclosure.

As shown in FIG. 19, the display panel may further include a sixth metal layer 117 and a fifth metal layer 116. The sixth metal layer 117 is located at the side of the second pin 112 away from the substrate 1. Specifically, the sixth metal layer 117 may be located at one side of the fourth conductive portion 1122 away from the substrate 1. One side of the sixth metal layer 117 away from the substrate 1 is flush with one side of the second insulating layer 115 away from the substrate 1. The fifth metal layer 116 is located at the side of the sixth metal layer 117 away from the substrate 1. The fifth metal layer 116 completely covers the sixth metal layer 117. A portion of the fifth metal layer 116 is located at the side of the second insulating layer 115 away from the substrate 1. It should be illustrated that the sixth metal layer 117 is provided in a same layer and formed in a same material as the second metal layer 105. The fifth metal layer 116 is provided in a same layer and formed in a same material as the third metal layer 107.

The filling of the sixth metal layer 117 makes the fifth metal layer 116 into a relatively flat film, and the circuit board 3 is connected to the display panel by means of the ACF 4, reducing the risk of the conductive particles of the ACF 4 cracking the second insulating layer 115, reducing the risk of the second insulating layer 115 peeling off from the second planarization layer 114, thereby effectively reducing the risk of the peeling off of the circuit board in the process.

An embodiment of the present disclosure provides a display device. Referring to FIGS. 1 and 2, the display device includes a chip 2, a circuit board 3, and the display panel described in any of the above embodiments of the present disclosure. The first pin is connected to one or both of a pin of the chip 2 and a pin of the circuit board 3 by means of a conductive adhesive.

The display panel includes a display area 12 and a non-display area 10. The non-display area 10 may include a first region 100 and a second region 110. The first pin 102 is located in the first region 100, and the second pin 112 is located in the second region 110. It can be understood that the chip 2 and the circuit board 3 serve as a type of the electronic devices to be connected respectively. The pin of the chip 2 may be connected to the first pin by means of the conductive adhesive, or the pin of the circuit board 3 may be connected to the first pin by means of the conductive adhesive. It is also possible to connect the pin of the chip 2 to the first pin by means of the conductive adhesive, and to connect the pin of the circuit board 3 to the second pin 112 by means of the conductive adhesive.

The structure of the display panel has been described in detail above and is therefore not repeated here. The beneficial effects of the display device may also refer to the beneficial effects of the display panel.

The display device may be used in traditional electronic devices, such as cell phones, computers, TVs, and camcorders, as well as emerging wearable devices, such as virtual reality devices and augmented reality devices, which are not enumerated herein.

It should be illustrated that the display device includes other necessary components and compositions in addition to the display panel. Taking the display device as an example, specifically for example, other necessary components and compositions may include a housing, a power cord, and so on, which may be supplemented accordingly by the those skilled in the art based on specific requirements for use of the display device, and are not enumerated herein.

After considering the specifications and practicing the present disclosure, those skilled in the art will easily come up with other embodiments of the present disclosure. The purpose of the present disclosure is to cover any variations, uses, or adaptations of the present disclosure, which follow the general principles of the present disclosure and include common knowledge or commonly used technical means in the technical field that are not disclosed in the present disclosure. The specification and embodiments are only considered exemplary, and the true scope and spirit of the present disclosure are indicated by the accompanying claims.

What is claimed is:

1. A display panel, wherein the display panel is provided with a display area and a non-display area at least located at one side of the display area, the non-display area comprises a first region, and the display panel comprises:

a substrate;

a plurality of sub-pixels, located in the display area;

a plurality of data lines, located in the display area and the non-display area and electrically connected to the plurality of the sub-pixels;

a first insulating layer set, located at one side of the substrate, wherein the first insulating layer set is provided with a plurality of first openings, and the plurality of the first openings are located at intervals in the first region;

a plurality of first pins, located in the plurality of the first openings in a corresponding manner and electrically connected to the plurality of the data lines;

a first metal layer, located between two adjacent first pins and electrically insulated from the two adjacent first pins;

a first planarization layer, located at one side of the first metal layer away from the substrate;

a second metal layer, located at one side of the first planarization layer away from the substrate and electrically insulated from the two adjacent first pins;

a first insulating laver, located at one side of the second metal layer away from the substrate and covering the second metal layer and the first planarization layer, wherein edge of the first insulating layer covers edge of one side of the first pin away from the substrate; and a third metal layer, located at the side of the first pin away from the substrate and at one side of the first insulating layer away from the substrate.

2. The display panel according to claim 1, wherein the first planarization layer is provided with a first disconnection region exposing the first metal layer, and the second metal layer passes through the first disconnection region and is connected to the first metal layer.

3. The display panel according to claim 1, wherein the first insulating layer set between the two adjacent first pins is provided with a first groove, and the first metal layer is at least partially arranged in the first groove.

4. The display panel according to claim 1, wherein the second metal layer covers the side of the first planarization layer away from the substrate and one side of the first pin away from the substrate, the first planarization layer is provided with a first disconnection region, the second metal layer is provided with a second disconnection region, and an orthographic projection of the second disconnection region on the substrate is located within an orthographic projection of the first disconnection region on the substrate.

5. The display panel according to claim 1, wherein a third recess is arranged at the side of the first metal layer away from the substrate, a third protrusion is arranged at one side of the first planarization layer close to the substrate, the third protrusion is filled in the third recess, a fourth recess is arranged at the side of the first planarization layer away from the substrate, a fourth protrusion is arranged at one side of the second metal layer close to the substrate, and the fourth protrusion is filled in the fourth recess.

6. The display panel according to claim 1, further comprising a first protection layer, located at one side of the first insulating layer set away from the substrate and located at one side of the first planarization layer close to the substrate, wherein a first recess is arranged at one side of the first protection layer away from the substrate, the first planarization layer is provided with a first protrusion matching the first recess, and the first protrusion is filled in the first recess.

7. The display panel according to claim 6, wherein the first recess passes through the first protection layer, and the first protrusion passes through the first recess and is connected to the first insulating layer set.

8. The display panel according to claim 6, wherein the first recess comprises at least two strip-shaped grooves distributed in parallel, and the first protrusion comprises at least two convex bars.

9. The display panel according to claim 8, wherein along a direction perpendicular to an extension direction of the strip-shaped groove, the strip-shaped groove is provided with a rectangular, curved or triangular cross-sectional shape, and the convex bar is provided with a rectangular, curved or triangular cross-sectional shape matching the cross-sectional shape of the strip-shaped groove.

10. The display panel according to claim 6, wherein the first recess comprises a plurality of dot-shaped recessing portions distributed in an array, and the first protrusion comprises protrusions being in one-to-one correspondence with each of the dot-shaped recessing portions.

11. The display panel according to claim 1, further comprising:

a fourth metal layer, located between the first pin and the third metal layer, wherein one side of the fourth metal layer away from the substrate is flush with the side of the first insulating layer away from the substrate.

12. The display panel according to claim 1, wherein the non-display area further comprises a second region, and in the second area, the display panel further comprises:

a second insulating layer set, located at a same side of the substrate as the first insulating layer set;

a plurality of second pins, located at one side of the second insulating layer set away from the substrate;

a second protection layer, located at the side of the second insulating layer set away from the substrate and between two adjacent second pins, wherein a second recess is arranged at one side of the second protection layer away from the substrate;

a second planarization layer, located at the side of the second protection layer away from the substrate, wherein the second planarization layer is provided with a second protrusion matching the second recess, and the second protrusion is filled in the second recess; and a second insulating layer, located at one side of the second planarization layer away from the substrate, and located in a partial area at one side of the second pin away from the substrate.

13. The display panel according to claim 12, further comprising:

a sixth metal layer, located at the side of the second pin away from the substrate, wherein one side of the sixth metal layer away from the substrate is flush with one side of the second insulating layer away from the substrate; and a fifth metal layer, located at the side of the sixth metal layer away from the substrate, wherein the fifth metal layer covers the sixth metal layer and is located at the side of the second insulating layer away from the substrate.

14. The display panel according to claim 13, wherein the sixth metal layer is provided in a same layer and formed in a same material as the second metal layer, and the fifth metal layer is provided in a same layer and formed in a same material as the third metal layer.

15. The display panel according to claim 12, wherein the first insulating layer set comprises a first insulating sub-layer, a second insulating sub-layer, a third insulating sub-layer and a fourth insulating sub-layer arranged sequentially along a direction away from the substrate, the second insulating layer set comprises a fifth insulating sub-layer, a sixth insulating sub-layer, a seventh insulating sub-layer and an eighth insulating sub-layer arranged sequentially along a direction away from the substrate, the first insulating sub-layer is provided in a same layer and formed in a same material as the fourth insulating sub-layer, the second insulating sub-layer is provided in a same layer and formed in a same material as the fifth insulating sub-layer, the third insulating sub-layer is provided in a same layer and formed in a same material as the sixth insulating sub-layer, and the fourth insulating sub-layer is provided in a same layer and formed in a same material as the eighth insulating sub-layer.

16. The display panel according to claim 1, wherein the first pin comprises:

a first electrode portion, located at one side of the substrate; and a second electrode portion, located at one side of the first electrode portion away from the substrate, wherein at least part of the second electrode portion is located at one side of the first insulating layer set away from the substrate, and edge of one side of the second electrode portion away from the substrate is covered by the first planarization layer.

17. The display panel according to claim 16, wherein the second electrode portion comprises:

a first conductive portion, located at the side of the first electrode portion away from the substrate, wherein at least part of the first conductive portion is located at the side of the first insulating layer set away from the substrate;

a second conductive portion, covering the first conductive portion, and at least partially located at the side of the first insulating layer set away from the substrate.

18. The display panel according to claim 17, wherein the second conductive portion is provided in a same layer and formed in a same material as the first metal layer.

19. A display device, comprising:

a chip;

a circuit board; and a display panel, wherein the display panel is provided with a display area and a non-display area at least located at one side of the display area, the non-display area comprises a first region, and the display panel comprises:

a substrate;

a plurality of sub-pixels, located in the display area;

a plurality of data lines, located in the display area and the non-display area and electrically connected to the plurality of the sub-pixels;

a first insulating layer set, located at one side of the substrate, wherein the first insulating layer set is provided with a plurality of first openings, and the plurality of the first openings are located at intervals in the first region;

a plurality of first pins, located in the plurality of the first openings in a corresponding manner and electrically connected to the plurality of the data lines;

a first metal layer, located between two adjacent first pins and electrically insulated from the two adjacent first pins;

a first planarization layer, located at one side of the first metal layer away from the substrate;

a second metal layer, located at one side of the first planarization layer away from the substrate and electrically insulated from the two adjacent first pins;

a first insulating layer, located at one side of the second metal layer away from the substrate and covering the second metal layer and the first planarization layer, wherein edge of the first insulating layer covers edge of one side of the first pin away from the substrate; and a third metal layer, located at the side of the first pin away from the substrate and at one side of the first insulating layer away from the substrate; wherein the first pin is connected to one or both of a pin of the chip and a pin of the circuit board by means of a conductive adhesive.

20. A display panel, wherein the display panel is provided with a display area and a non-display area at least located at one side of the display area, the non-display area comprises a first region, and the display panel comprises:

a substrate;

a plurality of sub-pixels, located in the display area;

a plurality of data lines, located in the display area and the non-display area and electrically connected to the plurality of the sub-pixels;

a first insulating layer set, located at one side of the substrate, wherein the first insulating layer set is provided with a plurality of first openings, and the plurality of the first openings are located at intervals in the first region;

a plurality of first pins, located in the plurality of the first openings in a corresponding manner and electrically connected to the plurality of the data lines;

a first metal layer, located between two adjacent first pins and electrically insulated from the two adjacent first pins;

a first planarization layer, located at one side of the first metal layer away from the substrate;

a second metal layer, located at one side of the first planarization layer away from the substrate and electrically insulated from the two adjacent first pins; and a first protection layer, located at one side of the first insulating layer set away from the substrate and located at one side of the first planarization layer close to the substrate, wherein a first recess is arranged at one side of the first protection layer away from the substrate, the first planarization layer is provided with a first protrusion matching the first recess, and the first protrusion is filled in the first recess.

* * * * *